(12) United States Patent
Alexanian et al.

(10) Patent No.: US 8,868,397 B2
(45) Date of Patent: Oct. 21, 2014

(54) TRANSACTION CO-VALIDATION ACROSS ABSTRACTION LAYERS

(75) Inventors: Herve Jacques Alexanian, San Jose, CA (US); Chien Chun Chou, Saratoga, CA (US)

(73) Assignee: Sonics, Inc., Milpitas, CA (US)

( * ) Notice: Subject to any disclaimer, the term of this patent is extended or adjusted under 35 U.S.C. 154(b) by 1245 days.

(21) Appl. No.: 11/653,648

(22) Filed: Jan. 12, 2007

(65) Prior Publication Data

US 2008/0120085 A1    May 22, 2008

Related U.S. Application Data

(63) Continuation-in-part of application No. 11/561,815, filed on Nov. 20, 2006, now abandoned.

(51) Int. Cl.
*G06F 17/50* (2006.01)
(52) U.S. Cl.
CPC ................................ *G06F 17/5022* (2013.01)
USPC .............. 703/16; 716/106; 716/113; 716/108
(58) Field of Classification Search
USPC ........... 703/13, 14, 17, 20, 16; 716/5, 6, 101, 716/108, 111, 113, 106; 702/182
See application file for complete search history.

(56) References Cited

U.S. PATENT DOCUMENTS

| | | |
|---|---|---|
| 4,189,767 A | 2/1980 | Ahuja |
| 4,375,097 A | 2/1983 | Ulug |
| 4,393,470 A | 7/1983 | Miard |
| 4,476,498 A | 10/1984 | Sheean |
| 4,688,188 A | 8/1987 | Washington |
| 5,107,257 A | 4/1992 | Fukuda |
| 5,218,456 A | 6/1993 | Stegbauer et al. |
| 5,265,257 A | 11/1993 | Simcoe et al. |
| 5,274,769 A | 12/1993 | Ishida |
| 5,287,464 A | 2/1994 | Kumar et al. |
| 5,363,484 A | 11/1994 | Desnoyers et al. |
| 5,379,379 A | 1/1995 | Becker et al. |
| 5,440,752 A | 8/1995 | Lentz et al. |
| 5,469,433 A | 11/1995 | McAuley |
| 5,469,473 A | 11/1995 | McClear et al. |
| 5,530,901 A | 6/1996 | Nitta |

(Continued)

FOREIGN PATENT DOCUMENTS

| | | |
|---|---|---|
| EP | 1678620 | 6/2011 |
| JP | 5-12011 | 1/1993 |

(Continued)

OTHER PUBLICATIONS

M. Caldari et al., "Transaction-Level Models for AMBA Bus Architecture Using SystemC 2.0", 2003, IEEE, pp. 1-6.*

(Continued)

*Primary Examiner* — Kamini S Shah
*Assistant Examiner* — Juan Ochoa
(74) *Attorney, Agent, or Firm* — Rutan & Tucker, LLP

(57) ABSTRACT

A method, apparatus, and system in which a modeling tool made up of a testbench executable program validates behavior of one or more sub-components of an electronic system design modeled as one or more executable behavioral models and a transactor translates a behavior of the sub-components between one or more different levels of abstraction derived from a same design.

11 Claims, 9 Drawing Sheets

(56) References Cited

U.S. PATENT DOCUMENTS

| | | | |
|---|---|---|---|
| 5,546,546 A | 8/1996 | Bell et al. | |
| 5,557,754 A | 9/1996 | Sone et al. | |
| 5,634,006 A | 5/1997 | Baugher et al. | |
| 5,664,153 A | 9/1997 | Farrell | |
| 5,673,416 A | 9/1997 | Chee et al. | |
| 5,708,659 A | 1/1998 | Rostoker et al. | |
| 5,745,913 A | 4/1998 | Pattin et al. | |
| 5,748,629 A | 5/1998 | Caldara et al. | |
| 5,781,918 A | 7/1998 | Lieberman et al. | |
| 5,809,538 A | 9/1998 | Pollmann et al. | |
| 5,872,773 A | 2/1999 | Katzela et al. | |
| 5,917,804 A | 6/1999 | Shah et al. | |
| 5,926,649 A | 7/1999 | Ma et al. | |
| 5,948,089 A | 9/1999 | Wingard et al. | |
| 5,982,780 A | 11/1999 | Bohm et al. | |
| 5,996,037 A | 11/1999 | Emnett | |
| 6,002,861 A * | 12/1999 | Butts et al. | 703/16 |
| 6,023,720 A | 2/2000 | Aref et al. | |
| 6,092,137 A | 7/2000 | Huang et al. | |
| 6,104,690 A | 8/2000 | Feldman et al. | |
| 6,105,094 A | 8/2000 | Lindeman | |
| 6,119,183 A | 9/2000 | Briel et al. | |
| 6,122,690 A | 9/2000 | Nannetti et al. | |
| 6,141,355 A | 10/2000 | Palmer et al. | |
| 6,141,713 A | 10/2000 | Kang | |
| 6,154,801 A * | 11/2000 | Lowe et al. | 710/119 |
| 6,167,445 A | 12/2000 | Gai et al. | |
| 6,182,183 B1 | 1/2001 | Wingard et al. | |
| 6,182,258 B1 * | 1/2001 | Hollander | 714/739 |
| 6,198,724 B1 | 3/2001 | Lam et al. | |
| 6,199,131 B1 | 3/2001 | Melo et al. | |
| 6,212,611 B1 | 4/2001 | Nizar et al. | |
| 6,215,789 B1 | 4/2001 | Keenan et al. | |
| 6,215,797 B1 | 4/2001 | Fellman et al. | |
| 6,249,144 B1 | 6/2001 | Agrawal et al. | |
| 6,253,269 B1 | 6/2001 | Cranston et al. | |
| 6,266,718 B1 | 7/2001 | Klein | |
| 6,330,225 B1 | 12/2001 | Weber et al. | |
| 6,335,932 B2 | 1/2002 | Kadambi et al. | |
| 6,363,445 B1 | 3/2002 | Jeddeloh | |
| 6,393,500 B1 | 5/2002 | Thekkath | |
| 6,430,156 B1 | 8/2002 | Park et al. | |
| 6,466,825 B1 | 10/2002 | Wang et al. | |
| 6,487,621 B1 | 11/2002 | MacLaren | |
| 6,499,090 B1 | 12/2002 | Hill et al. | |
| 6,510,497 B1 | 1/2003 | Strongin et al. | |
| RE37,980 E | 2/2003 | Elkhoury et al. | |
| 6,526,462 B1 | 2/2003 | Elabd | |
| 6,530,007 B2 | 3/2003 | Olarig et al. | |
| 6,536,028 B1 | 3/2003 | Katsioulas et al. | |
| 6,578,117 B2 | 6/2003 | Weber | |
| 6,628,609 B2 | 9/2003 | Chapman et al. | |
| 6,636,482 B2 | 10/2003 | Cloonan et al. | |
| 6,678,645 B1 | 1/2004 | Rajsuman et al. | |
| 6,683,474 B2 | 1/2004 | Ebert et al. | |
| 6,701,504 B2 | 3/2004 | Chang et al. | |
| 6,721,325 B1 | 4/2004 | Duckering et al. | |
| 6,725,313 B1 | 4/2004 | Wingard et al. | |
| 6,785,753 B2 | 8/2004 | Weber et al. | |
| 6,804,738 B2 | 10/2004 | Weber | |
| 6,804,757 B2 | 10/2004 | Weber | |
| 6,816,814 B2 | 11/2004 | Ebert et al. | |
| 6,845,341 B2 * | 1/2005 | Beverly et al. | 702/182 |
| 6,862,265 B1 | 3/2005 | Appala et al. | |
| 6,874,039 B2 | 3/2005 | Ganapathy et al. | |
| 6,877,076 B1 | 4/2005 | Cho et al. | |
| 6,880,133 B2 | 4/2005 | Meyer et al. | |
| 6,882,966 B2 | 4/2005 | Ryu et al. | |
| 6,941,538 B2 | 9/2005 | Hwang et al. | |
| 6,976,106 B2 | 12/2005 | Tomlinson et al. | |
| 7,050,958 B1 | 5/2006 | Bortfeld et al. | |
| 7,062,423 B1 | 6/2006 | Sheredy | |
| 7,085,702 B1 | 8/2006 | Hwang et al. | |
| 7,116,131 B1 | 10/2006 | Chirania et al. | |
| 7,120,712 B2 | 10/2006 | Wingard et al. | |
| 7,120,765 B2 | 10/2006 | Dodd et al. | |
| 7,149,829 B2 | 12/2006 | Weber et al. | |
| 7,155,554 B2 | 12/2006 | Vinogradov et al. | |
| 7,191,273 B2 | 3/2007 | Weber | |
| 7,194,561 B2 | 3/2007 | Weber | |
| 7,194,566 B2 | 3/2007 | Wingard et al. | |
| 7,194,658 B2 | 3/2007 | Staton et al. | |
| 7,254,603 B2 | 8/2007 | Weber et al. | |
| 7,266,786 B2 | 9/2007 | Chou et al. | |
| 7,277,975 B2 | 10/2007 | Vinogradov et al. | |
| 7,296,105 B2 | 11/2007 | Weber et al. | |
| 7,299,155 B2 | 11/2007 | Ebert et al. | |
| 7,302,691 B2 | 11/2007 | Masri et al. | |
| 7,325,221 B1 | 1/2008 | Wingard et al. | |
| 7,356,633 B2 | 4/2008 | Weber et al. | |
| 7,543,088 B2 | 6/2009 | Weber et al. | |
| 7,543,093 B2 | 6/2009 | Chou et al. | |
| 7,552,292 B2 | 6/2009 | Hsieh et al. | |
| 7,574,629 B2 | 8/2009 | Douady et al. | |
| 7,587,535 B2 | 9/2009 | Sawai | |
| 7,590,815 B1 | 9/2009 | De Waal | |
| 7,596,144 B2 | 9/2009 | Pong | |
| 7,598,726 B1 | 10/2009 | Tabatabaei | |
| 7,665,069 B2 | 2/2010 | Weber | |
| 7,684,968 B1 | 3/2010 | Szedo et al. | |
| 7,694,249 B2 | 4/2010 | Hamilton et al. | |
| 7,852,343 B2 | 12/2010 | Tanaka et al. | |
| 7,899,953 B2 | 3/2011 | Inoue | |
| 7,941,771 B2 * | 5/2011 | Kaszynski et al. | 716/104 |
| 8,020,124 B2 | 9/2011 | Alexanian et al. | |
| 8,108,648 B2 | 1/2012 | Srinivasan et al. | |
| 8,165,865 B2 * | 4/2012 | Parker et al. | 703/14 |
| 2001/0026535 A1 | 10/2001 | Amou et al. | |
| 2002/0038397 A1 | 3/2002 | Singh et al. | |
| 2002/0083256 A1 | 6/2002 | Pannell | |
| 2002/0129173 A1 | 9/2002 | Weber et al. | |
| 2002/0129210 A1 | 9/2002 | Arimilli et al. | |
| 2002/0138687 A1 | 9/2002 | Yang et al. | |
| 2002/0152297 A1 | 10/2002 | Lebourg et al. | |
| 2002/0174227 A1 | 11/2002 | Hartsell et al. | |
| 2002/0188432 A1 | 12/2002 | Houlihane et al. | |
| 2003/0004699 A1 | 1/2003 | Choi et al. | |
| 2003/0023794 A1 | 1/2003 | Venkitakrishnan et al. | |
| 2003/0074519 A1 | 4/2003 | Weber | |
| 2003/0074520 A1 | 4/2003 | Weber | |
| 2003/0079080 A1 | 4/2003 | DeMoney | |
| 2003/0088721 A1 | 5/2003 | Sharma | |
| 2003/0188271 A1 | 10/2003 | Zhuang et al. | |
| 2003/0208614 A1 | 11/2003 | Wilkes | |
| 2004/0010652 A1 | 1/2004 | Adams et al. | |
| 2004/0128341 A1 | 7/2004 | Synek | |
| 2004/0153928 A1 | 8/2004 | Rohrbaugh et al. | |
| 2004/0177186 A1 | 9/2004 | Wingard et al. | |
| 2005/0086412 A1 | 4/2005 | Douady et al. | |
| 2005/0117589 A1 | 6/2005 | Douady et al. | |
| 2005/0141505 A1 | 6/2005 | Douady et al. | |
| 2005/0144585 A1 | 6/2005 | Daw et al. | |
| 2005/0157717 A1 | 7/2005 | Douady et al. | |
| 2005/0210164 A1 | 9/2005 | Weber et al. | |
| 2005/0210325 A1 | 9/2005 | Douady et al. | |
| 2005/0268268 A1 | 12/2005 | Wang et al. | |
| 2006/0047890 A1 | 3/2006 | Van De Waerdt | |
| 2006/0129963 A1 | 6/2006 | Martin et al. | |
| 2006/0218315 A1 | 9/2006 | Okajima et al. | |
| 2006/0225015 A1 | 10/2006 | Synek et al. | |
| 2006/0242525 A1 | 10/2006 | Hollander et al. | |
| 2007/0028196 A1 | 2/2007 | Martin et al. | |
| 2007/0038791 A1 | 2/2007 | Subramanian et al. | |
| 2007/0083830 A1 | 4/2007 | Hamilton et al. | |
| 2007/0094429 A1 | 4/2007 | Wingard et al. | |
| 2007/0110052 A1 | 5/2007 | Kok et al. | |
| 2008/0028090 A1 | 1/2008 | Kok et al. | |
| 2008/0086577 A1 | 4/2008 | Huang | |
| 2008/0120082 A1 | 5/2008 | Alexanian et al. | |
| 2008/0235421 A1 | 9/2008 | Jayaratnam et al. | |
| 2008/0320254 A1 | 12/2008 | Wingard et al. | |
| 2008/0320255 A1 | 12/2008 | Wingard et al. | |
| 2008/0320268 A1 | 12/2008 | Wingard et al. | |
| 2008/0320476 A1 | 12/2008 | Wingard et al. | |

(56) References Cited

U.S. PATENT DOCUMENTS

| | | | |
|---|---|---|---|
| 2009/0150136 A1* | 6/2009 | Yang | 703/13 |
| 2009/0235020 A1 | 9/2009 | Srinivasan et al. | |
| 2010/0042759 A1 | 2/2010 | Srinivasan et al. | |
| 2010/0211935 A1 | 8/2010 | Weber et al. | |

FOREIGN PATENT DOCUMENTS

| | | |
|---|---|---|
| JP | 11-191075 | 7/1999 |
| JP | H11-250004 | 9/1999 |
| JP | 2000-250853 | 9/2000 |
| JP | 2006-277404 | 10/2006 |
| JP | 5144934 | 11/2012 |
| KR | 10-1196048 | 10/2012 |
| WO | WO 00/29956 | 5/2000 |
| WO | WO 01/75620 | 10/2001 |
| WO | WO 0193477 A1 | 12/2001 |
| WO | WO03/034242 | 4/2003 |
| WO | WO2005/045727 | 5/2005 |
| WO | WO2009/002998 | 12/2008 |

OTHER PUBLICATIONS

Clouard et al., "Towards Bridging the Precision Gap between SoC Transactional and Cycle Accurate Levels", Date 2002, pp. 1-8.*

Dupenloup et al., Transistor abstraction for the functional verification of FPGAs, 2006, 43rd ACM/IEEE Design Automation Conference, pp. 1069-1072.*

Frank Ghenassia, Transaction Level Modeling With SYSTEMC, Oct. 13, 2005, ISBN 978-0-387-26233-8, pp. 1-271.*

Chou, Joe, et al, "System-Level Design Using OCP Based Transaction-Level Models" Denali MemCon Taiwan, Mar. 15, 2005, 23 pages.

Haverinen, Anssi, et al, SystemC™ based SoC Communication Modeling for the OCP™ Protocol, V1.0, Oct. 14, 2002, 39 pages.

U.S. Appl. No. 11/203,554, filed Aug. 11, 2005, Chou et al.

Alexanian, H., Bolden, G., Amir, Z., "Simplifying the Behavior of System C Descriptions for Hardware/Software Covalidation," copyright 2005 [retrieved Apr. 26, 2008] Retreived from the Internet. <URL: www.ocpip.org/pressroom/schedule/speaking/papers_presentations/Summit_OCP-IP_pavillion_pres.pps>.

PCT International Search Report and Written Opinion, International application No. PCT/US07/84980, 7 pages, mailed May 20, 2008.

Cottrell, Donald, Chapter 78: "Design Automation Technology Roadmap", The VLSI Handbook, Copyright 2000, 41 Pages.

Hurst, Stanley L., Chapter 5: "Computer Aided Design", VLSI Custom Microelectronics: Digital, Analog, and Mixed-Signal, Copyright 1999, 95 pages.

Sofiene Tahar, "Assertion and Model Checking of SystemC", hardware Verification Group, Department of Electrical and Computer Engineering, Concordia University Montreal, Quebec, Canada, First Annual North American SystemC Users Group (NASCUG) Meeting, Jun. 7, 2004, pp. 28.

Alan Kamas, "Dot.Org—Open Core Protocol: The SystemC Models" article, published in Apr./May 2004 issue of Chip Design Magazine, http://www.chipdesignmag.com/print/php?articleId=28?issueId=4, pp. 2.

Alan Kamas, "The SystemC OCP Models, an Overview of the SystemC Models for the Open Core Protocol", NASCUG Sep. 29, 2004, Copyright alan Kamas 2004, www.kamas.com, pp. 30.

2nd NASCUG Meeting Agenda, Meeting Presentations, GSPx 2004, Santa Clara, CA U.S.A., Sep. 29, 2004, http://www.nascug.org/nascug2004_fall.agenda.html, North American SystemC Users Group, pp. 2.

Robert Siegmund et al., "SystemCSV: An Extension of SystemC for Mixed Multi-Level Communication Modeling and Interface-Based System Design", 2001, IEEE, pp. 1-7.

Mosensoson, Guy, "Practical Approaches to SOC Verification", Verisity Design, Inc., http://citeseerx.ist.psu.edu/viewdoc/download?doi=10.1.1.115.1427&rep=rep1&type=pdf, Date unknown, 9 pages.

Texas A&M University—Department of Computer Science and Engineering, Embedded Systems and Codesign Laboratory, "SoC and NoC, Core-Network Interface (CNI) Design and Analysis", http://codesign.cs.tamu.edu/index.php/research/soc-and-noc, Date unknown, 4 pages.

SOCCentral.com, "Error Checking and Functional Coverage with SystemVerilog Assertions", http://soccentral.com/results.asp?CatID=488&EntryID=21594, Feb. 2, 2007, 5 pages.

Non-Final Office Action for U.S. Appl. No. 11/203,554, mailed Feb. 13, 2008, 13 pages.

Final Office Action for U.S. Appl. No. 11/203,554, mailed Sep. 16, 2008, 24 pages.

Non-Final Office Action for U.S. Appl. No. 11/097,027, mailed Aug. 8, 2006, 5 pages.

Non-Final Office Action for U.S. Appl. No. 11/097,027, mailed Nov. 3, 2006, 9 pages.

Final Office Action for U.S. Appl. No. 11/097,027, mailed May 18, 2007, 9 pages.

Non-Final Office Action for U.S. Appl. No. 11/246,809, mailed Mar. 17, 2008, 6 pages.

Non-Final Office Action for U.S. Appl. No. 11/398,036, mailed Oct. 6, 2008, 5 pages.

Non-Final Office Action for U.S. Appl. No. 11/398,036, mailed Mar. 20, 2009, 11 pages.

Non-Final Office Action for U.S. Appl. No. 11/561,815, mailed Sep. 24, 2009, 37 pages.

G Maruccia et al., "OCCN On-Chip-Communication-Network" From On-Chip bus to Network-on-Chip, a unique modeling framework, Advanced System Technology STMicroelectronics, Jun. 7, 2004, pp. 12.

Bakr Younis et al., "Operating System for Switched Analog Mixed-Signal Circuits", The Ohio State University Department of Electrical and Computer Engineering Design Automation Research Lab (DARL), Jun. 7, 2004, pp. 12.

Richard Ruigrok, "Hardware-Software Co-Simulation with System C", Qualcomm Incorporated, Jun. 7, 2004, pp. 17.

"1st NASCUG Meeting", Meeting Presentations, http:\\www.nascug.org/nascug2004_spring.html North American SystemC Users Group, Jun. 7, 2004, pp. 2.

Gupta, Sumit and Gupta, Rajesh K., Chapter 64: "ASIC Design", The VLSI Handbook, Copyright 2000, 29 pages.

United States Patent & Trademark Office, memo from Love, John J., Deputy Commissioner for Patent Examination Policy, entitled, "Clarification of Interim Guidelines for Examination of Patent Applications for Subject Matter Eligibility", Apr. 12, 2007, 2 pgs.

Black, Co-Founder, "Eklectic Ally Electronic Systems Solutions", SystemC 2.1 Preview—DAC2004, www.EklecticAlly.com, info@EklecticAlly.com, Version 1.0 Copyright 2003, pp. 12.

Paul Klein et al., "Passive TLM", Intel Corporation, Paul.J.Klein@intel.com, Zafer.Kadi@intel.com, Jun. 7, 2004, pp. 16.

Wilson Snyder, "Verilator and SystemPerl", Sun Microsystems, VeriPool, wsnyder@wsnyder.org, http://www.veripool.com, Jun. 2004, pp. 14.

Stuart Swan, Senior Architect, "System C-Towards a SystemC Transaction level Modeling Standard", Cadence Design Systems, Inc., Jun. 2004 pp. 12.

Brian McMurtrey et al., "SystemC Enabling Embedded System Design at Sandia", Sandia National Laboratories, Apr. 14, 2004, pp. 11.

Calypto Design Systems, Inc., "Navigting the RTL to System Continuum", www.calypto.com, 2005, pp. 1-6.

"Open Core Protocol (OCP)", Wikipedia, the free encyclopedia, http://en.wikipedia.org/wiki/Open_Core_Protocol, Feb. 9, 2009, 2 pages.

"Open Core Protocol", search query on Trademark Electronic Search System (TESS), United States Trademark and Patent Office, Feb. 7, 2009, 2 pages.

"Open Core Protocol", results of search query on Trademark Electronic Search System (TESS), United States Trademark and Patent Office, Feb. 7, 2009, 2 pages.

"Open Core Protocol Transaction Level 2", search query on Trademark Electronic Search System (TESS), United States Trademark and Patent Office, Feb. 7, 2009, 2 pages.

(56) References Cited

OTHER PUBLICATIONS

"Open Core Protocol Transaction Level 2", results of search query on Trademark Electronic Search System (TESS), United States Trademark and Patent Office, Feb. 7, 2009, 2 pages.

"SystemC", search query on Trademark Electronic Search System (TESS), United States Trademark and Patent Office, Feb. 7, 2009, 2 pages.

"SystemC", results of search query on Trademark Electronic Search System (TESS), United States Trademark and Patent Office, Feb. 7, 2009, 2 pages.

"SystemC", Wikipedia, the free encyclopedia, http://en.wikipedia.org/wiki/SystemC, Feb. 9, 2009, 6 pages.

Advisory Action for U.S. Appl. No. 11/203,554 mailed Feb. 24, 2009, 3 pages.

Advisory Action for U.S. Appl. No. 11/097,027 mailed Aug. 17, 2007, 3 pages.

Examiner's Answer for U.S. Appl. No. 11/097,027 mailed Dec. 31, 2007, 21 pages.

Non-Final Office Action for U.S. Appl. No. 12/122,988 mailed Aug. 30, 2010, 6 pages.

Non-Final Office Action for U.S. Appl. No. 12/122,988 mailed Dec. 16, 2010, 8 pages.

U.S. Appl. No. 13/276,041, filed Oct. 18, 2011, Wingard et al.

Non-Final Office Action for U.S. Appl. No. 12/706,656, mailed Feb. 15, 2012, 26 pages. U.S. Patent and Trademark Office, Alexandria, Virginia, USA.

Final Office Action for U.S. Appl. No. 12/706,656, mailed Jul. 25, 2012, 37 pages. U.S. Patent and Trademark Office, Alexandria, Virginia, USA.

Advisory Action for U.S. Appl. No. 12/706,656, mailed Nov. 15, 2012, 4 pages. U.S. Patent and Trademark Office, Alexandria, Virginia, USA.

Zhang, Hui, "Service Disciplines for Guaranteed Performance Service in Packet-Switching Networks" Proceedings of the IEEE, vol. 83, No. 10, pp. 1374-1396. Oct. 1995, DOI: 10.1109/5.469298.

Non-Final Office Action for U.S. Appl. No. 12/122,988 mailed Dec. 16, 2010, 10 pages. U.S. Patent and Trademark Office, Alexandria, VA USA.

Notice of Allowance for U.S. Appl. No. 12/122,988 mailed May 19, 2011, 12 pages. U.S. Patent and Trademark Office, Alexandria, VA USA.

Ahn, Jung Ho, et al., "The Design Space of Data-Parallel Memory Systems", IEEE, 12 pages, Nov. 2006.

"Intel Dual-Channel DDR Memory Architecture" White Paper Informational Brochure, Infineon Technologies North America Corporation and Kingston Technolgy Company, Inc., 14 pages, Sep. 2003.

OCP (Open Core Protocol) Specification, Release 2.0, OCP International Partnership, OCP-IP Association, 210 pages, 2003.

Weber, Wolf-Dietrich, et al., "A Quality-of-Search Mechanism for Interconnection Networks in System-on-Chips", Section 1530-1591/05, IEEE, 6 pages, 2005.

Weber, Wolf-Dietrich, "Efficient Shared Dram Subsystems for SOCs", Sonics, Inc. Systems on the ICs, 6 pages, 2001.

Wingard, Drew, "A Non-Blocking Intelligent Interconnect for AMBA-Connected SoCs", Sonics, Inc., CoWare Arm Developer's Conference, 39 pages, Oct. 6, 2005.

Wingard, Drew, "Socket-Based Design Using Decoupled Interconnects", Interconnect-Centric Design for Advanced SOC and NOC, 30 pages, 2002.

Wingard, Drew, Sonics SOC Integration Architecture Presentation, Systems-ON-ICS, 25 pages, Jan. 28, 1999.

Wingard, Drew, "Tiles: The Heterogeneous Processing Abstraction for MPSoc Presentation", Sonics, Smart Interconnect IP, 35 pages, Jul. 7, 2004.

"IEEE 100: The Authoritative Dictionary of IEEE Standards Terms", 2000, IEEE, 7th Edition, IEEE Standard 100-2000, pp. 570 and 693.

Reisslein et al., "A Framework for Guaranteeing Statistical QoS", In IEEE/ACM Transactions on Networking, vol. 10, No. 1, Feb 2002, pp. 27-42, 16 pages.

Stiliadis et al., "Latency-Rate Servers: A General Model for Analysis of Traffic Scheduling Algorithms", In Proceedings of IEEE Infocom 96, Apr. 1996, pp. 111-119, 9 pages.

Goossens et al., "Networks on Silicon: Combining Best-Effort and Guaranteed Services", In Proceeding of 2002 Design, 3 pages.

Rijpkema et al., "Trade Offs in the Design of a Router with Both Guaranteed and Best-Effort Services for Networks on Chip", In Proceedings of Design Automation and Test Conference in Europe, Mar. 2003, 6 pages.

Lahiri, K., et al., "Lotterybus: A New High-Performance Communication Architecture for Systemon-Chip Designs". In Proceedings of Design Automation Conference 2003, Las Vegas, Jun. 2001, pp. 15-20, 6 pages.

Dally, William J., "Virtual-channel Flow Control", In Proceedings of the 17th Int. Symp. on Computer Architecture, ACM SIGARCH, May 1990, vol. 18, No. 2, pp. 60-68, 9 pages.

Wingard, Drew, et al., "Integration Architecture for System-on-a-Chip Design", In Proc. of the 1998 Custom Integrated Circuits Conference, May 1998, pp. 85-88, 4 pages.

Jantsch, Axel, et al., "Networks on Chip", Kluwer Academic Publishers, 2003. Cover, Title Page, Contents, (4 pages) Chapters 1-5, (pp. 3-106,) Chapters 7-8, (pp. 131-172) & Chapter 10, (pp. 193-213), 170 pages.

Weber, Wolf-Dietrich, et al., "Enabling Reuse via an IP Core-centric Communications Protocol: Open Core Protocol", In Proceedings of the IP 2000 System-on-Chip Conference Mar. 2000, pp. 1-5.

Adan et al., "Queueing Models and some Fundamental Relations", Chapter 3, XP-002329104, Feb. 14, 2001, pp. 23-27 (double-sided copy).

Lamport, Leslie, "How to Make a Multiprocessor Computer that Correctly Executes Multiprocess Programs", XP-009029909, IEEE Transactions on Computers, vol. C-28, No. 9, Sep. 1979, pp. 690-691 (double-sided copy).

Rixner, Scott, et al., "MemoryAccess Scheduling", to appear in ISCA27 (2000), Computer Systems Laboratory, Stanford University, Stanford, CA 94305 pp. 1-11.

Rixner, et al., "A Bandwidth-Efficient Architecture for Media Processing", Micro-31, (1998), pp. 1-11.

Wingard, Drew, "Tiles-An Architectural Abstraction for Platform-Based Design," Perspective article 2, EDAVision, Jun. 2002, 3 pages, www.edavision.com.

"Open Core Protocol Specification," OCP International Partnership, Release 1.0, 2001, 2 pgs.

Wingard, Drew, PhD., "Integrating Semiconductor IP Using µ Networks," ASIC Design, Jul. 2000 electronic engineering, 3 pages.

Chou, Joe, "System-Level Design Using OCP Based Transaction-Level Models," presentation, Denali MemCom Taiwan 2005, OCP International Partnership, 23 pages.

Casini, Phil, "Measuring the Value of Third Party Interconnects," Sonics, Inc., White Paper, 2005, 11 pages, www.sonicsinc.com.

Hardware Verification Group, "SystemC Verification Problematic", System-on-Chip Verification <http://hvg.ece.concordia.ca/Research/SoC/>, 2004, pp. 26.

De Meer, H.; Richter, J.-P.; Puliafito, A.; Tomarchio, O., "Tunnel agents for enhanced Internet QoS," Concurrency, IEEE, vol. 6, No. 2, pp. 30-39, Apr.-Jun. 1998, URL: http//ieeexplore.ieee.org/stamp/stamp.jsp?arnumber=6787878isnumber=14923.

Melvin, S. and Patt, Y. 2002. Handling of packet dependencies: a critical issue for highly parallel network processors. In Proceedings of the 2002 international Conference on Compilers, Architecture, and Synthesis for Embedded Systems (Grenoble, France, Oct. 8-11, 2002). Cases '02. ACM, New York, NY, 202-209.

Wingard, Drew, "MicroNetworks-Based Integration for SOCs." In Design Automation Conference, 2001, pp. 673-677, 5 pages.

Wielage et al., "Networks on Silicon: Blessing or Nightmare?" Keynote speech Proceedings of the Euromicro Symposium on Digital System Design, Dortmund, Germany, Sep. 2002, 5 pages.

Ho et al., "The Future of Wires". In Proceedings of the IEEE, vol. 89, No. 4, pp. 490-504, Apr. 2001, 15 pages.

(56) References Cited

OTHER PUBLICATIONS

Dally et al., "Route Packets, Not Wires: On-Chip Interconnection Networks." In Design Automation Conference, pp. 684-689, Jun. 2001, 6 pages.

Benini et al., "Networks on Chips: A New SoC Paradigm", In IEEE 2002, Computer, vol. 35, No. 1, pp. 70-78, 9 pages.

Kurose, "Open Issues and Challenges in Providing Quality of Service Guarantees in High-Speed Networks", ACM Computer Communication Review, vol. 23, No. 1, pp. 6-15, Jan. 1993, 10 pages.

\* cited by examiner

US 8,868,397 B2

TRANSACTION CO-VALIDATION ACROSS ABSTRACTION LAYERS

RELATED APPLICATIONS

This application is a continuation-in part of and claims the benefit of U.S. patent application titled "TRANSACTION CO-VALIDATION ACROSS ABSTRACTION LAYERS", Ser. No. 11/561,815, and filed on Nov. 20, 2006 now abandoned.

NOTICE OF COPYRIGHT

A portion of the disclosure of this patent document contains material that is subject to copyright protection. The copyright owner has no objection to the facsimile reproduction by anyone of the software engine and its modules, as it appears in the Patent and Trademark Office Patent file or records, but otherwise reserves all copyright rights whatsoever.

FIELD OF THE INVENTION

Embodiments of the invention generally relate to electronic system design verification. An aspect is related to verification of the electronic system design at different levels of abstraction.

BACKGROUND OF THE INVENTION

High-level system description methodologies can allow designers and system architects to modify the traditional system design approach. Some languages, such as SystemC, may allow system architects to model a circuit or system at a transaction-level in order to test the specified functionality and get early performance reports.

The traditional design cycle still follows or often runs concurrently with this architectural modeling. The design will be written in a hardware description level usually at RTL (register transfer level) to be synthesized and finalized into silicon. This brings up the need for a correlation of disparate descriptions of the same circuit or system.

The problem can be turned around chronologically as well but with the same verification challenges. Silicon IP vendors may be required to provide a transaction-level model of their part in order for their customers to realize a high-level simulation of a system embedding the part. This means that an existing design with a RTL description may need to be modeled at the transaction-level.

SUMMARY OF THE INVENTION

Various methods and apparatuses are described for co-validating transactions across multiple abstraction layers. A modeling tool made up of a testbench executable program may validate behavior of one or more sub-components of an electronic system design modeled as one or more executable behavioral models. A transactor may translate a behavior of the one or more sub-components between the one or more different levels of abstraction derived from the same electronic system design based upon an applied sequence of test patterns and expected test results from the same instance of the testbench executable program. A transactional-testbench interface allows the transactor to access and exploit the applied sequences generated by the testbench executable program. The testbench executable program, the transactor, and the transactional-testbench interface are to be stored and executed on a machine readable storage medium.

BRIEF DESCRIPTION OF THE DRAWINGS

The drawings refer to embodiments of the invention in which.

Figure 1:
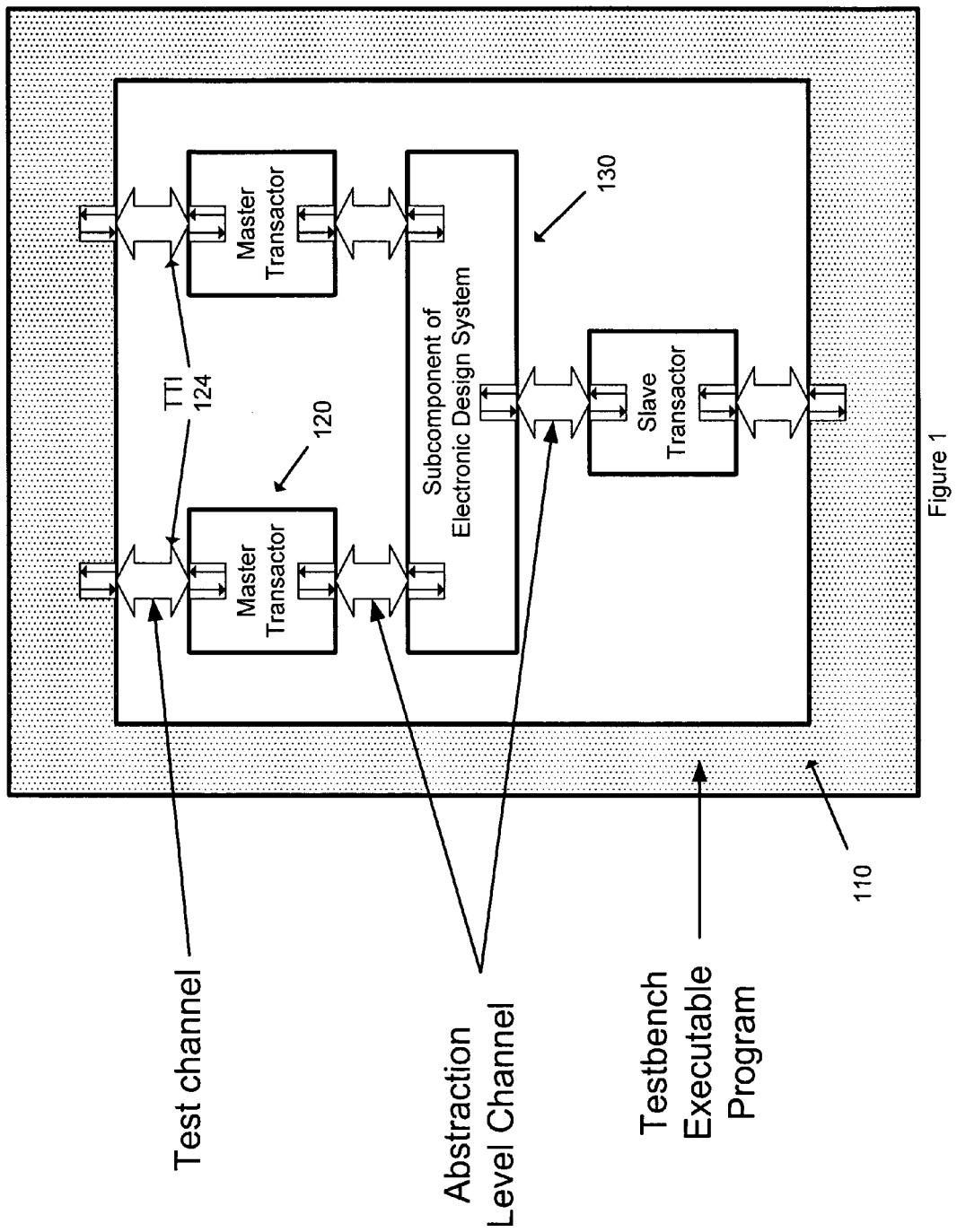
FIG. 1 illustrates a block diagram of an embodiment of a modeling tool for performing transaction co-validation across multiple abstraction layers including a test-bench executable program.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references such as a first instance of a transactor, may be made. However, the specific numeric reference should not be interpreted as a literal sequential order but rather interpreted that the first instance of a transactor is different than a second instance of a transactor. Thus, the specific details set forth are merely exemplary. The specific details may be varied from and still be contemplated to be within the spirit and scope of the present invention.

In general, various methods and apparatuses are described for co-validating transactions across multiple abstraction layers. A modeling tool including a testbench executable program validates the behavior of one or more sub-components of an electronic system design modeled as one or more executable behavioral models. The testbench executable program may include code scripted as a sequence of test patterns and expected test results used to validate the behavior of the sub-components. A same instance of the test bench executable program may provide the sequence of test patterns and expected test results to validate the modeled sub-components at the different levels of abstraction. Thereby, eliminating a need to generate a new instance of the test bench executable program for each different level of abstraction of a design to be tested. A transactor may translate a behavior of the one or more sub-components between the one or more different levels of abstraction derived from the same electronic system design based upon an applied sequence of test patterns and expected test results from the same instance of the testbench executable program. A transactional-testbench interface allows the transactor to access and exploit the applied sequences generated by the testbench executable program. The transactor may convert stimulus requests and responses sent between the testbench executable program and the electronic system design under verification to the necessary level of abstraction. The testbench executable program, the transactor, and the transactional-testbench interface are to be stored and executed on a machine readable storage medium.

As discussed, many electronic system designs are written at a Register-transfer level (RTL) description of a circuit or system in a hardware description language. Generally, a RTL description describes what intermediate information (i.e. information stored between clock cycles in an electronic circuit) is stored in registers, where it is stored within the design, and how that information moves through the design as it operates. The RTL description of an electronic system is a functional description at least one level of abstraction higher than the individual gate layout of the electronic design system (e.g., gate-level implementation/Netlist). The RTL description fully and explicitly describes virtually all of the logic and sequential operations of the circuit. RTL descriptions are commonly written in standard languages such as Verilog or VHDL and are intended for logic synthesis and mapping with a commercial logic synthesizer.

A transaction-level model can be a software coded model of a circuit or a system where data transfers are simplified and abstracted. This model is typically written in a high level software language, such as C, C++ or SystemC. RTL may be considered Transaction Level 0 (TL0) and correspond directly with signals in the open core protocol specification. Transaction Level 1 (TL1) modeling may correspond to a given protocol's phase level on an individual transfer basis and be cycle accurate. Transaction Level 2 (TL2) modeling may correspond to one or more open core protocol transfers or transactions at the same time and be transaction accurate but cycle approximate. For example, if a system implements burst data transfers between components, this burst may be expressed using a single function call in the implementation language. The difference in the number of application programming interface calls or events can cause timing inaccuracies between these different levels of abstraction.

A transaction can be a functional unit of data transfer through a system. A transaction may be an aggregate of multiple data transfers but is tied by a semantic unity. For example, a transaction may merely be group transfers at consecutive addresses between the same two components of the system.

A testbench can be the instantiation of a description of the Design under verification (DUV) along with meaningful sequences of stimulus applied to the system in order to validate functionality. The DUV is generally a sub component of the electronic design system and described as an abstract executable representation that may include a hierarchical set of subroutines or classes in a programming language, or modules (Verilog) or entities (VHDL) in a hardware description language.

There may be a need to validate two or more descriptions of the same circuit or system. With the complexity of modern systems, the verification process that consists of developing a complete testbench for the system is long and costly. It is accounted for with the same care as the resources and schedule allocated to the design of the system itself.

Therefore, the perspective of developing multiple instances of different testbenches for these different descriptions is very unappealing. Designing a truly re-usable common testbench across descriptions of a system at different levels of abstraction that cooperates with one or more instances of a transactional-testbench interface that does translations between different levels of abstraction is desirable.

FIG. 1 illustrates a block diagram of an embodiment of a modeling tool for performing transaction co-validation across multiple abstraction layers. An embodiment of the modeling tool may include a transactional testbench executable program 110 and a number of transactors 120. The modeling tool may be used to validate performance of one or more sub-components of an electronic system design under verification 130 across one or more different levels of abstraction. The modeling tool may also include such components as channels, transactors and layer adapters as defined in transaction level methodologies of languages such as SystemC and SystemVerilog.

The transactor 120 connects to a transactional-testbench interface (TTI) 124. The transactor 120 is able to exploit the methods of the transactional-testbench interface to extract transactions issued by the testbench executable program 110. Methods of the transactional-testbench interface 124 are usually implemented outside the transactor 120, such as a Test Channel shown in FIG. 1. Compliance with the transactional-testbench interface 124 is a requirement transactors 120 should fulfill to be compatible with a testbench executable program 110.

The testbench executable program 110 may contain code scripted as a sequence of test patterns and expected test results that are used to validate the behavior of the sub-components 130. The key is to define the abstraction level that is suitable for the highest level model of the electronic system design. This means defining a data structure that represents a transaction of the system. A same instance of the testbench executable program 110 provides the sequence of test patterns and expected test results to validate the modeled sub-components 130 at the different levels of abstraction.

The testbench executable program 110 defines the transaction data structure of the electronic system design. Once the transaction data structure is defined, the communication means of the testbench executable program 110 to a transactor 120 goes through a transactional-testbench interface 124. The transactor 120 translates a timing, a functional, or other type of behavior of the sub-components 130 between one or more different levels of abstraction derived from a same electronic system design. For example, if the electronic system design under verification is coded at the RTL level of abstraction, then each transaction sent from the testbench executable program 110 is converted to individual signals corresponding to the planned wires at the RTL level. Essentially, the RTL corresponds to code lines written for a component level description on a chip. However, if the electronic system design under verification is coded at functional block level, then entire circuits consisting of, for example, thousands of components, may be represented in the software with a small amount of lines of code defining that circuit's inputs, outputs, capabilities, its responses to various inputs, and other high level characteristics of the circuit as opposed to characteristics of each individual component making up that circuit. Thus, two or more different SystemC/HDL descriptions of the same sub component may exist with different levels of abstraction correlating to the design.

Another example, another instance of the transactor 120 may convert each transaction to individual transfers if the design under test is coded at the transfer level of abstraction.

Overall, if the testbench executable program 110 is written at a higher level of abstraction than the level of abstraction of the subcomponent of the electronic system 130 under test, then the transactor 120 converts the level of abstraction of the coded commands, signals, etc. for responses from the inputted stimulus to the electronic system design under verification up to the abstraction level of the testbench executable program 110. The transactor 120 also converts the level of abstraction of the coded commands, signals, etc. for inputted stimulus to the electronic system design under verification from the testbench executable program 110 down to the abstraction level of the electronic system design under verification. The transactor 120 performs the opposite if the testbench executable program 110 is written at a lower level of abstraction than the subcomponent of the electronic system 130 under test. The transactor 120 does no conversion if the design under test is coded at the same level of abstraction as the testbench executable program 110.

The modeling tool may also address functional validation with a high-level model that merely describes approximate timing. This means the testbench executable program 110 needs an understanding of transactions and how to correlate them with a lower-level counterpart, which may be as detailed as individual wires of an RTL description. The sub components of the electronic system design under verification may have several disparate descriptions, each at a different level of abstraction describing the details of that sub component, that can all be verified using the same testbench executable program 110.

Figure 2A:
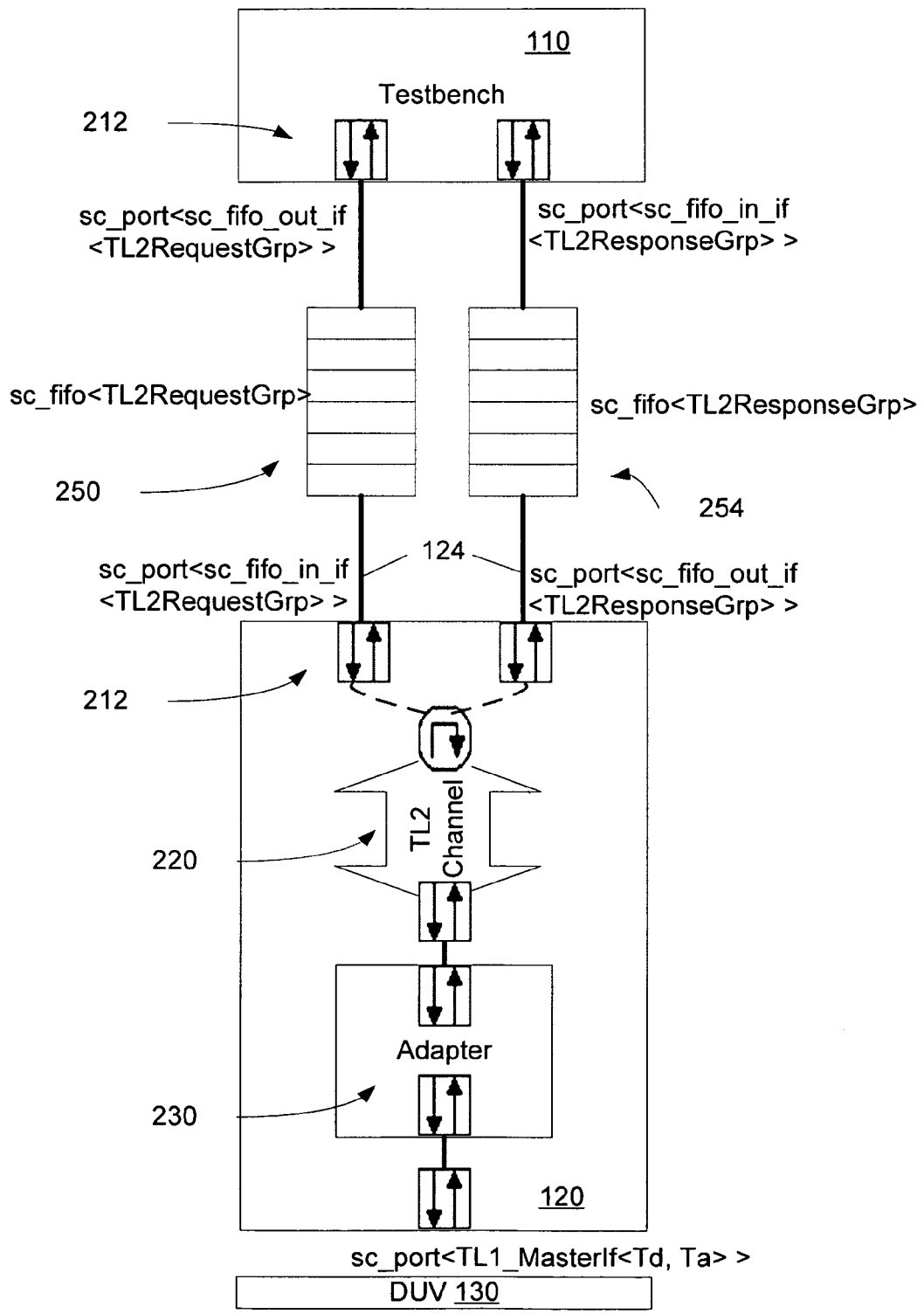
FIG. 2a illustrates a block diagram of an embodiment of a transactional-testbench interface interacting with a test-bench executable program.

FIG. 2a illustrates an embodiment of a transactional-testbench interface interacting with a testbench executable program. The testbench executable program 110 may include one or more ports 212, and/or one or more buffers 250. The transactor 120 may include one or more ports 212, an adapter 230 and a channel 220. The one or more ports 212 contain code to access the transactional testbench interface 124 and allow to connect with the testbench executable program through the buffer 250. The buffer 250 stores information such as requests and responses going between the testbench executable program 110 and the transactional-testbench interface 124. The channel 220 passes information between the adapter 230 and the ports 212. The transactor 120 may convert stimulus requests from the testbench executable program 110 from a first level of abstraction to a level of abstraction that the sub-component of the design under verification 130 possesses, and may also convert stimulus responses sent from the sub-components of the design under verification 130 from the level of abstraction that the design under verification possesses to the level of abstraction of the testbench executable program 110.

The testbench executable program 110 sends out one or more transactions at a transaction level of abstraction to the port interface 212 from the buffer. The buffer 250 provides storage for these requests and responses going between the testbench executable program 110 and the transactional-testbench interface 124. The transactor 120 receives the testbench transactions and sends them to a channel 220. The buffer 250 stores the transactions until the transactor 120 is ready to receive the transactions and convert the transactions to the level of abstraction of sub-components of the design under verification. Another buffer 254 also stores responses from the design under verification, via the transactional-testbench interface until those responses are analyzed. The adapter 230 converts responses from the design under verification to the level of abstraction of the testbench executable program.

The transactor's 120 role in traditional methodologies merely specifies the interface to the channel connected to the design under verification, but the transactional-testbench interface 124 is adapted to applying the same stimulus from the testbench executable program 110 in different contexts. The transactor's 120 role is to obtain the incoming transactions from the buffer 250 and convert them to a level of abstraction usable to drive the design under verification 130.

Figure 2B:
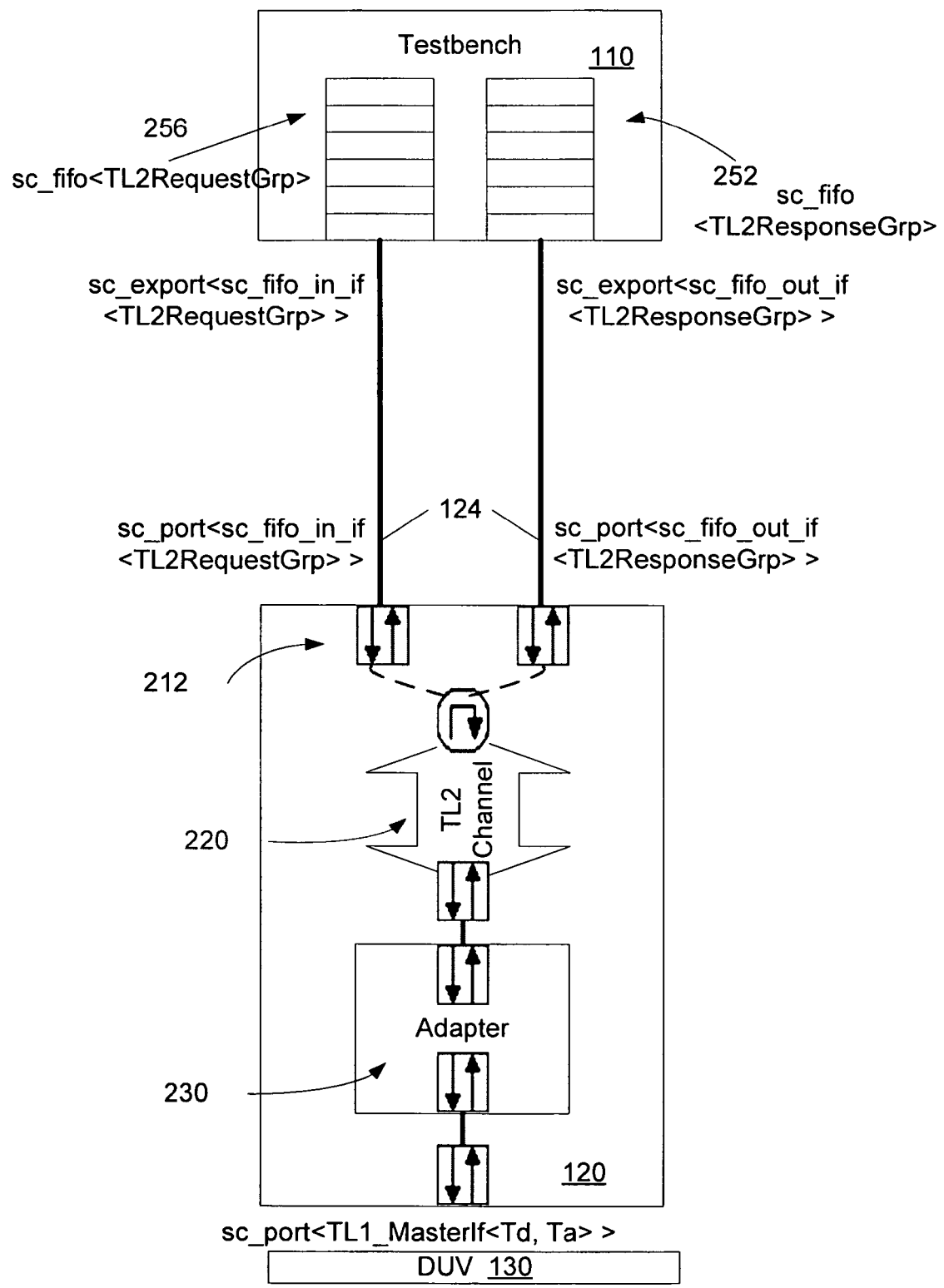
FIG. 2b illustrates a variant of FIG. 2a, where the testbench includes storage of transactions.

FIG. 2b illustrates a similar embodiment where the testbench executable program 110 can take on the intermediate storage of transactions between the testbench executable program 110 and the transactor 120. The testbench executable program 110 would include one or more internal First in first out export buffers 252, 256 of transaction data structures for each port of the electronic design system.

Figure 3:
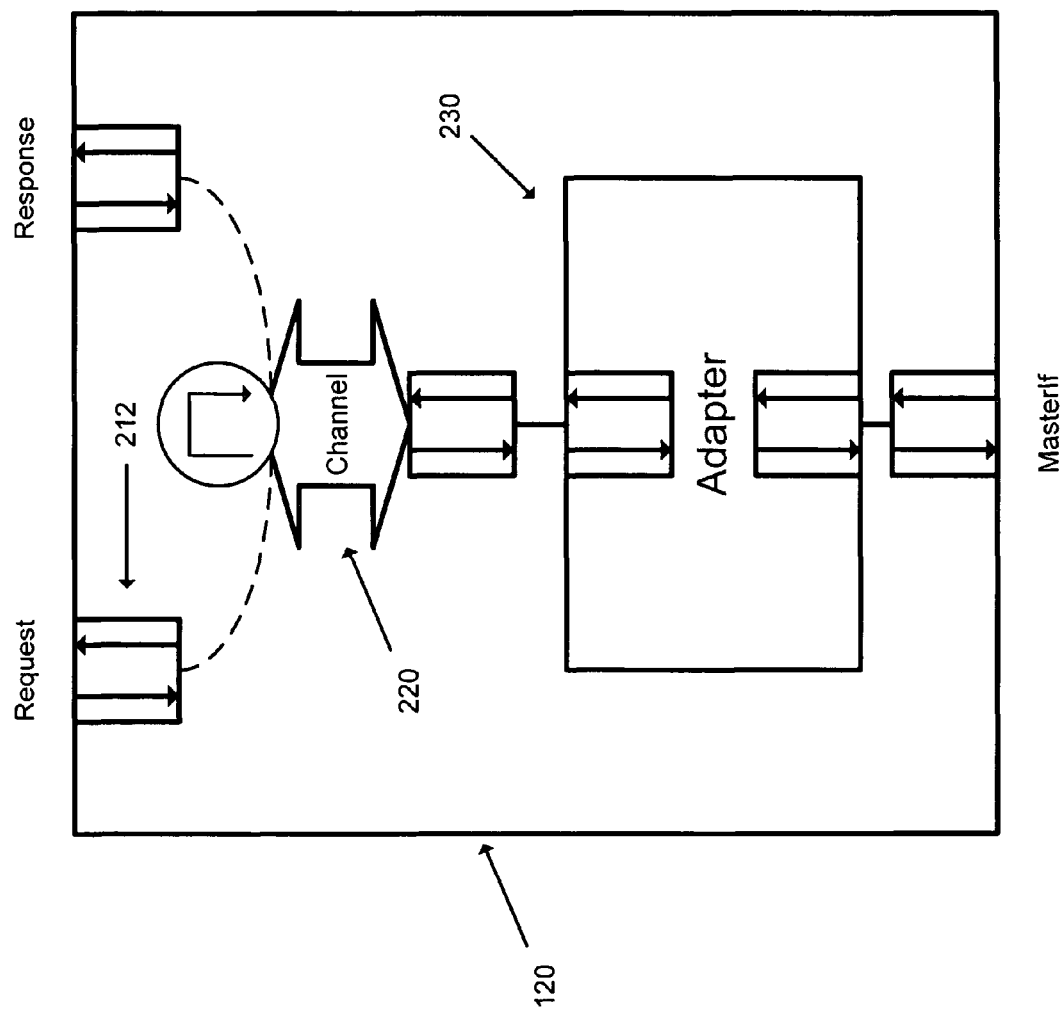
FIG. 3 illustrates a block diagram of another embodiment of a transactional-testbench interface.

FIG. 3 illustrates another embodiment of a block diagram of a transactional-testbench interface. The transactor 120 may include a port 212, an adapter 230 and a channel 220. The port contains code to interface with the testbench executable program. The channel stores information passed between the adapter 230 and the port interface 212. The adapter 230 may convert stimulus requests from the testbench executable program 110 from a first level of abstraction to a level of abstraction that the sub-component of the design under verification 130 possesses, and may also convert stimulus responses sent from the sub-components of the design under verification 130 from the level of abstraction that the design under verification possesses to the level of abstraction of the testbench executable program 110. In this embodiment, the port interface 212 receives the testbench transactions and sends them to a channel 220. The channel 220 has a buffer that stores the transactions until the adapter 230 is ready to receive the transactions and convert the transactions to the level of abstraction of sub-components of the design under verification. The adapter's 230 role is to gather the incoming transactions from the channel 220 and convert them to a level of abstraction usable to drive the design under verification. In an embodiment, multiple instances of the adapter 230 exist in the transactor 120. Each different instance is coded to convert between different levels of abstraction. In an embodiment, the transactional-testbench interface 120 may also have a First In First Out buffer of transactions. The port interface 212, the channel 220, and the adapter 230 may be coded as three separate modules or a single composite module.

For the purposes of an example, let Transaction Level 2 represent a modeling layer that describes passing transactions with approximate timing information. In the Open Core Protocol (OCP) context, this is a set of interfaces where OCP burst requests and responses can each be initiated with a single function call. Let Transaction Level 1 represent a modeling layer that describes individual data transfers with accurate protocol level phases. For example, phases of a transfer and handshakes are modeled accurately. Such a model is typically synchronous and can be used to describe a system cycle accurately.

In this example, the testbench executable program 110 would be used for validation of a TL1 model. The transactional-testbench interface 124 used in this case is a FIFO accessor of transaction data structures equivalent to the ones used in the TL2 interface of each protocol.

In order to connect to such a transactional-testbench interface 124, the testbench executable program 110 would simply need an internal FIFO of transaction data structures for each port of the design under verification. The testbench executable program 110 is able to simply concentrate on producing sequences of transactions without worrying about signal and timing details of how they are delivered to the sub-component of the design under verification 130. This can be modeled in SystemC using the templated sc_fifo interface classes (sc_fifo_in sc_fifo_out) or the templated tlm_fifo interface classes of the OSCI TLM standard.

The flow described here may be successfully carried out on models supporting an OCP socket. The following concrete data types may be used with SystemC and OCP:

Transaction Data Structure: OCPTL2RequestGrp and OCPTL2ResponseGrp. The data structures described in the ocp_globals.h header of the OCP-IP system C model package.
Transactional testbench interface (transactor):
sc_fifo_rd<OCPTL2RequestGrp> and
sc_fifo_wr<OCPTL2ResponseGrp>
Transactional testbench interface (testbench):
sc_fifo_wr<OCPTL2RequestGrp> and
sc_fifo_rd<OCPTL2ResponseGrp>
DUV interface (TL2): OCP_TL2_MasterIF< > and OCP_TL2_SlaveIF< >
DUV interface (TL1): OCP_TL1_MasterIF< > and OCP_TL1_SlaveIF< >

In an embodiment, the testbench executable program 110 may include an internal buffer of transaction data structures for each port of a sub-component of the electronic system design 130. The testbench executable program 110 is not required to have intimate knowledge of the sub-components of the electronic system design under verification 130. The testbench executable program 110 has a universal interface since the transactor 120 is coded separately and can be adjusted for the appropriate level of abstraction for sub-component of the electronic system design under verification 130.

Figure 4A:
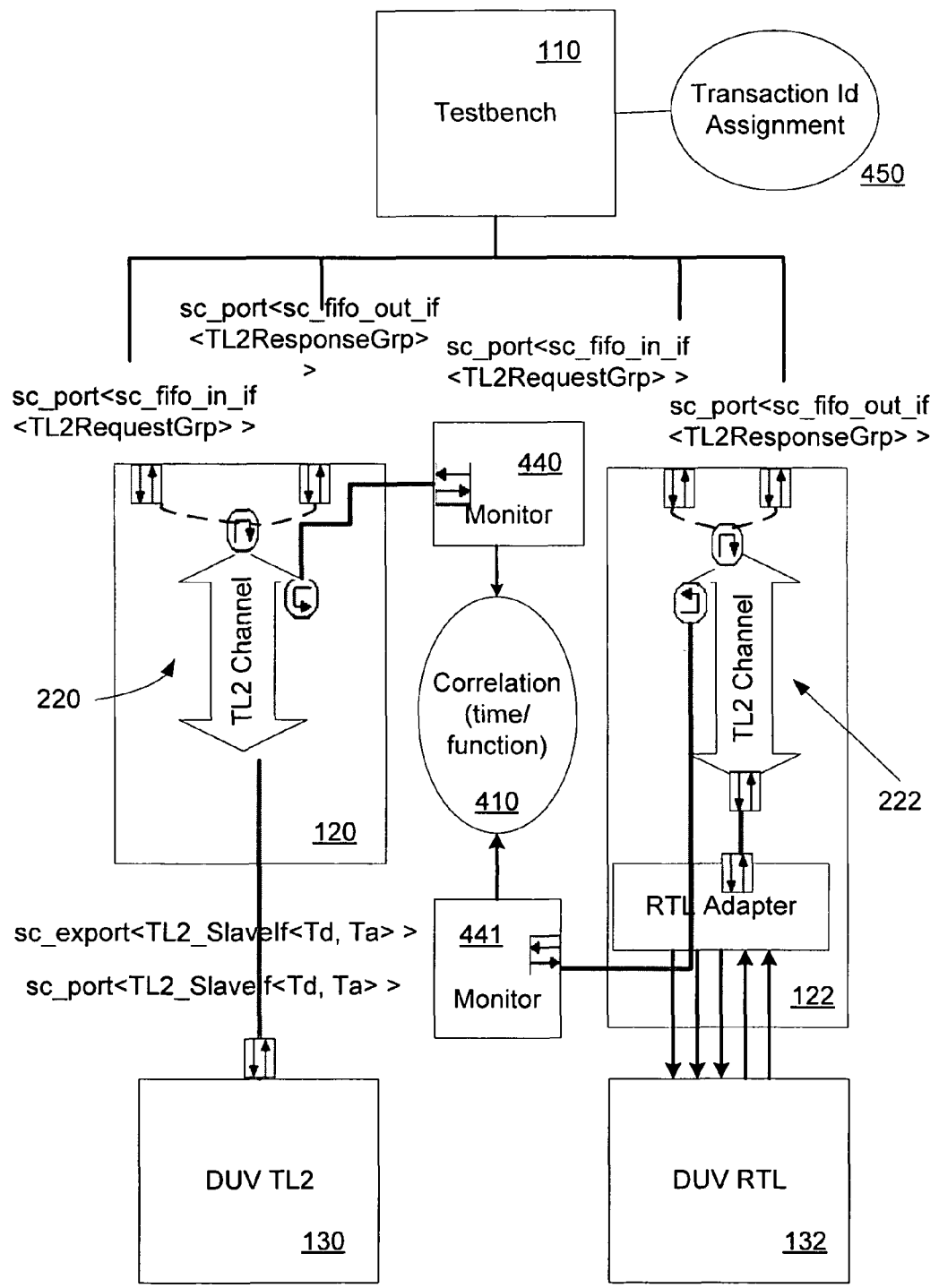
FIG. 4a illustrates a block diagram of an embodiment of a modeling tool with a testbench environment comparing designs under verification different levels of abstraction.

FIG. 4a illustrates a block diagram of an embodiment of a modeling tool with a testbench environment comparing designs under verification at different levels of abstraction. The testbench executable program 110 may send stimulus and receive responses to a first instance of the transactor 120 to test and verify a first design under verification 130 modeled at a TL2 level of abstraction. The same instance of the testbench executable program 110 may send stimulus and receive responses to a second instance of the transactor 122 to test and verify a second design under verification 132 modeled at a RTL level of abstraction. A first monitor 440 may record information from the first channel 220 in the first instance of the transactor 120. A second monitor 441 may record information from the second channel 222 in the second instance of the transactor 122. A correlation module 410 may establish a functional, timing or other correlation between the different levels of abstraction of a design under verification having the common testbench executable program applied to all levels of abstraction of the design under verification.

In operation, the sequence of test patterns and expected test results of the testbench executable program 110 are applied to the sub-component of the electronic system design under verification 130, 132 at two or more different levels of abstraction. The testing and verification may occur in parallel or in series. The testbench executable program 110 determines one or more behavioral descriptions of the sub-components 130 by applying a common stimulus to all different levels of abstraction of the sub-component 130, 132. The first monitor 440 records a first set of functional or timing results derived from the simulation of the sub-component 130 represented at a TL2 abstraction level. The second monitor 441 records a second set of function or timing results derived from the simulation of the sub-component 132 represented at a RTL abstraction level. The correlation module 410 compares the first set of functional or timing results to the second set of functional or timing results for one or more stimulus generated from the testbench executable program. A set of function results may include behavior to applied stimulus, such as whether an expected logic value occurs, or an expected blocking of a signal occurs, etc. Note, for timing correlation, the monitors 440, 441 may record timing data for later comparison by the correlation module as described more fully later. The functional correlation can include identifying that all of the transactions are present in the requests and responses collected by the monitors of the DUV at both levels of abstraction. Depending on the abstraction level of the model, the transactions may be expected to be found in the same order making the correlation simple. If order inaccuracy is tolerated, a mechanism for the testbench to assign unique identifiers to transactions is required. Naturally, the transaction identifiers will be found in both traces since the same testbench is used.

Thus, the monitors 440, 441 are used to correlate the behavioral descriptions of the sub-components between two or more different levels of abstraction from the same design having the common testbench executable program applied to all levels of abstraction. The role of these monitors 440, 441 is to record a textual description of all transactions as they are played through the test channel. Because of the position of the test channel, these monitors 440, 441 are independent of the sub-component of the electronic system design description 130 and will naturally produce traces that are comparable. The monitors 440, 441 obtain the comparable trace between the two or more simulations of the design 130, 132, which are at different levels of abstraction. The monitors 440, 441 may be connected to the invariant part of the transactor and are therefore recording comparable transactions. Note, in an embodiment, the correlation of behavioral descriptions of the sub-components may be done as a postprocess based on trace files recorded by the monitors in contrast to a cycle accurate case described later in FIG. 4b.

The modeling tool may be used for correlating a behavior of one or more sub-components of an electronic system design 130 modeled as one or more executable behavioral models to one or more different levels of abstraction derived from a same design. The modeling tool may also be used for validating the behavior of the sub-components 130 with a same instance of a testbench executable program 110.

The testbench executable program 110 defines the transaction data structure of an electronic system design, produces one or more sequences of test patterns and expected test results, and communicates the sequences of test patterns and expected test results at a first level of abstraction to the modeled sub-components of the electronic system design 130, at a second level of abstraction via a transactor 120. A transactor obtains each transaction from a channel of the transactional-testbench interface 124 and converts these transactions from a first level of abstraction to a second level of abstraction. The transactor may obtain and convert one or more transactions at a time.

The modeling tool may include a functional correlation module 410 to establish a functional correlation between the different levels of abstraction of a first sub-component 130 having the common testbench executable program 110 applied to all levels of abstraction of the sub-component 130. The responses of the sub-component's 130 are read through the monitors 440 and 441 and sent to a correlation module 410, which compares the results from the first abstraction level to the results at a second abstraction level.

The modeling tool may also include a timing module separate or coded within correlation module 410 to generate correlation measurements of timing approximation between the different levels of abstraction of the sub-components 130. A precise correlation may be generated by analyzing a specific location in the modeled sub-components 130 and comparing time differentials to get the same results at that location between the two different levels of abstraction.

To complete the validation, it may be determined if the behavior of two or more descriptions match some consistency criteria. This may depend on the timing requirements of the descriptions. In order to validate that the behavior matches, end-to-end checks may be performed. These are checks that involve the state of the transactions at the boundary of the system. For example, a typical transaction may be a read operation. The response obtained for the request is critical transaction data observable at the boundary. Verifying that all the requests that were sent produced the same response with two or more descriptions is a key co-validation measure.

This may be achieved with transactional monitors 440, 441 placed on each of the test channels. As discussed, the monitors 440, 441 produce traces that are comparable. The remaining challenge to establish a functional match between two or more traces is protocol specific. For example, it may involve finding matching transactions in a different order. This can be achieved by the addition of a unique identifier field to each transaction. The testbench executable program 110 assigns a unique identifier 450 to a first transaction generated as part of the stimulus from the testbench executable program 110. Using the unique identifier for the first transaction, the system can match functional results between different levels of abstraction of the sub-components of the electronic system design under verification 130. This may be done by matching a first transaction identifier from the first data set to a second transaction identifier from the second data set to find matching transactions. This identifier field will have to be supported by the protocol. For example, with OCP the MReqlnfo and SRespinfo fields that may be attached to transactions are a natural choice.

The match will then involve a program reading two or more traces of the testbench traffic, gathering them all by identifier and determining equivalence regardless of order and time. Then additional measures can be implemented such as the difference between the span (end time minus start time) of a transaction in each trace.

The behavior of one or more sub-components of an electronic system design, modeled as one or more executable behavioral models, may be correlated to one or more different levels of abstraction derived from a same design. The correlating of the behavior of the sub components may include: recording a first timing data derived from a first simulation of the sub-components represented at a first abstraction level; recording a second timing data derived from a second simulation of the sub-components represented at a second abstraction level; and then comparing the first timing data to the second timing data for one or more stimulus generated from the testbench executable program 110. End to end checks are verified concurrently with comparing timing results from the sub-components of the electronic system design under verification at different levels of abstraction. The correlating may also include: recording a first set of functional results derived from a first simulation of the sub-components represented at a first abstraction level; recording a second set of function results derived from a second simulation of the sub-components represented at a second abstraction level; and then comparing the first set of functional results to the second set of functional results when a stimulus from the testbench executable program 110 is generated. The testbench executable program 110 assigns a unique identifier 450 to a first transaction generated as part of the stimulus from the testbench executable program 110. The unique identifier 450 for the first transaction may be used to match functional results between different levels of abstraction of the sub-components of the electronic system design under verification.

A first transaction from the testbench executable program 110 is obtained and converted from a first level of abstraction to a second level of abstraction. A first data set, containing a response at a first level of abstraction to a request sent by the testbench executable program 110, is read from a first transaction monitor 440 placed on a first test channel. A second data set, containing a response at a second level of abstraction obtained for a request sent by the testbench executable program 110, is read from a second transaction monitor 441 placed on a second test channel. An equivalence of the responses found in the first data set and the second data set is determined for each level of abstraction of the sub-components.

The behavior of the sub-components with a same instance of a testbench executable program 110 may be validated. The instance of the testbench executable program 110 defines a transaction data structure of the electronic system design, produces one or more sequences of test patterns and expected test results, and communicates the sequences of test patterns and expected test results at a first level of abstraction to the modeled sub-components of the electronic system design, at a second level of abstraction via a transactional-testbench interface.

Figure 4B:
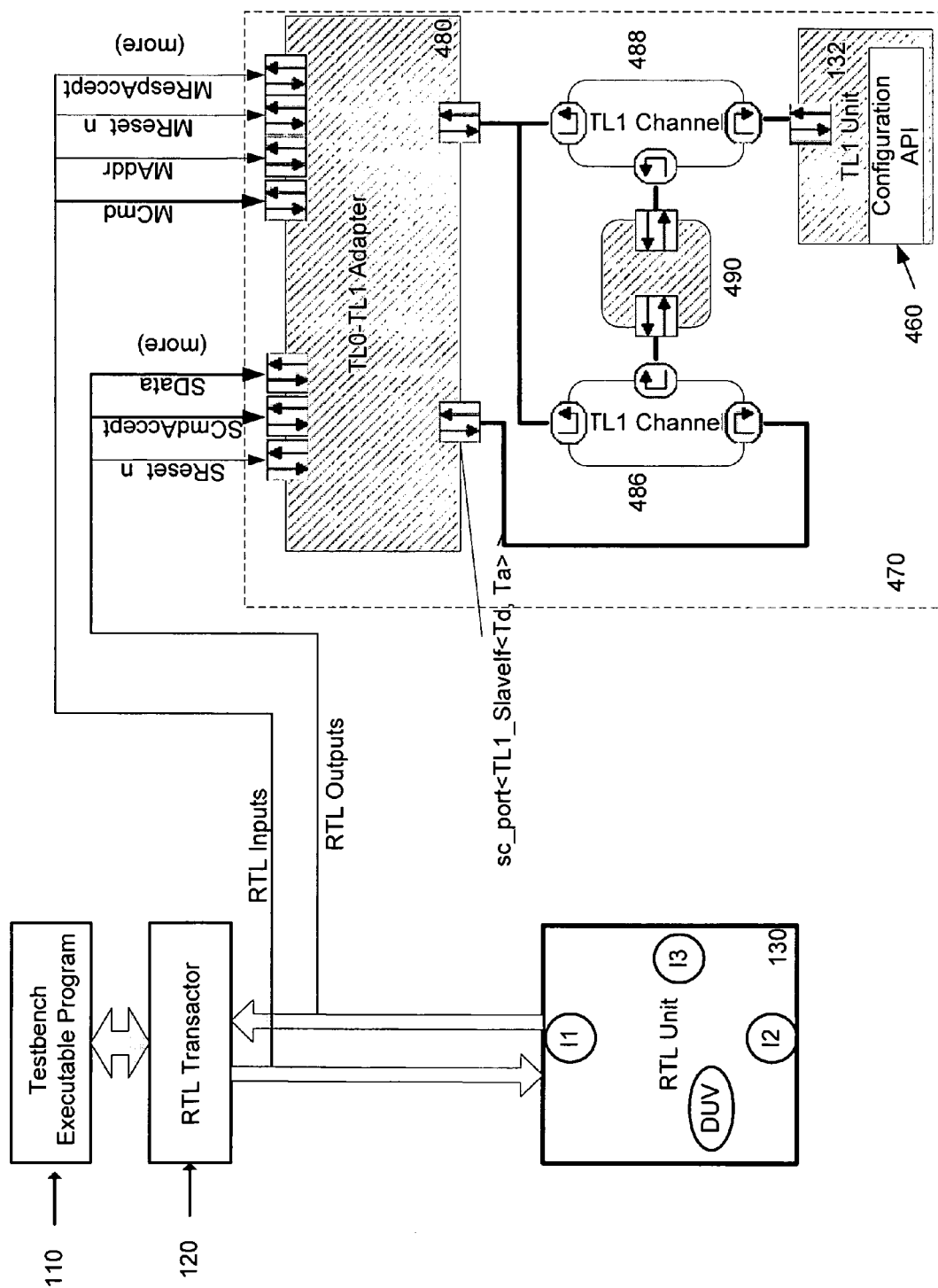
FIG. 4b illustrates a block diagram of an embodiment of a functional/timing correlation between an RTL description and another cycle accurate description of the DUV, where equivalence is established at a phase abstraction level.

FIG. 4b illustrates a block diagram of an embodiment of a functional/timing correlation between an RTL description and another cycle accurate description of the DUV, where equivalence is established at a phase abstraction level. Protocol phase definitions allow a precise correlation of a phase abstraction level with an RTL description.

In an embodiment, the SystemC-based modeling tool and unit testbench environment is used for the specific purpose of comparing cycle accuracy of two or more levels of abstraction. The sequence of test patterns and expected test results of the testbench executable program 110 are applied to a sub-component of the electronic system design under verification 130. The first level of abstraction may be the RTL level and the second level of abstraction may be TL1. The sequence of test patterns and expected test results are translated from the abstraction level of the testbench executable program 110 and then applied at a signal level to the sub-component of the electronic system design under verification 130. The RTL input and output signals are then derived to a correlation module 470 where correlation to the reference phase-accurate model 132 (TL1) can be established.

The correlation module 470 operates at the level of the reference phase-accurate abstracted model 132. Signal level inputs and outputs of the RTL unit description 130 are converted to the level of abstraction of the reference model 132 and connected to two channels 486 and 488 where abstracted traffic is compared by a correlation checker 490. The sole purpose of channel 486 is to re-create at an abstracted level the behavior of the RTL unit 130. Channel 488 is used to stimulate and collect the behavior of the reference model 132.

The modeling tool may also include a standard configuration application programming interface (API) 460 shown in FIG. 4b, coded in a derivative of C language to receive parameters of the modeled sub-components 130. The parameters received may include describe characteristics such as burst capabilities, data bus bit width, configuration information that includes hierarchical sets of parameters that define: the address map of the system, the register map of the system, arbitration priorities, etc. A configurable circuit or system can have its behavior modified by a number of parameters. This set of parameters is hierarchical and complex in the case of many products. In order to enable reuse through the test and modeling efforts, a consistent view of the configuration must be defined. This API 460 is used in most abstracted descriptions of the sub-component 130.

This justifies the need for a standard API 460 describing the configuration of the system. The API 460 may use a neutral language, such as a pure C or C++, which are especially appealing because they can be used in various flows. A C description or C++ description would integrate seamlessly with a SystemC description, and can also be used in most hardware description languages since they provide a C interface (standard in Verilog).

Figure 5:
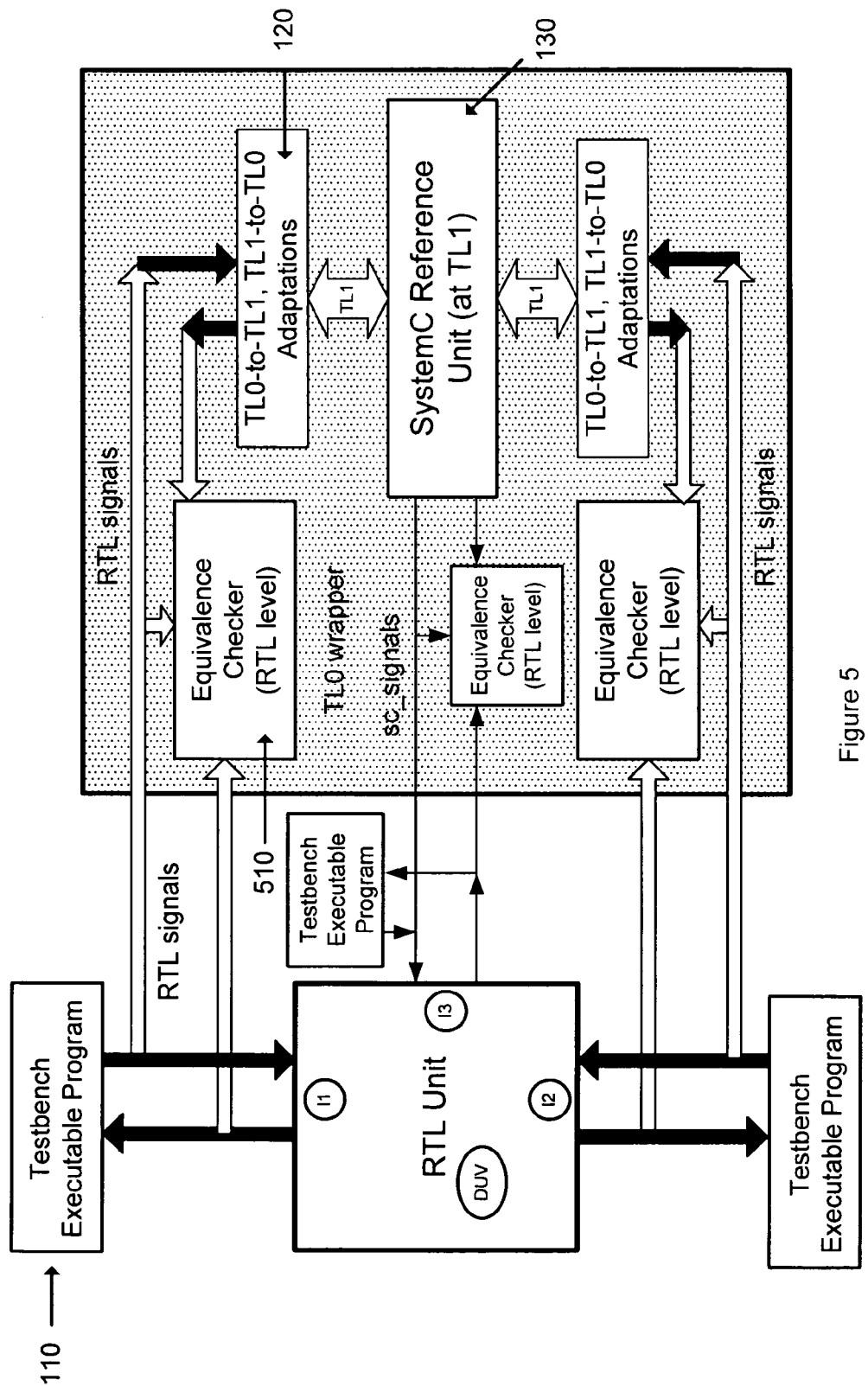
FIG. 5 illustrates a block diagram of an alternative embodiment of a SystemC-based modeling tool and unit testbench environment for a signal-level comparison of cycle accurate models.

FIG. 5 illustrates an embodiment of a SystemC-based modeling tool and unit testbench environment for functional/timing correlation between an RTL description and another cycle accurate description of the DUV. Because of cycle accuracy, equivalence can be established systematically at the cycle level. Protocol definitions allow the cycle accurate model some abstraction that can be easily reconciled when matching the results.

In an embodiment, an equivalence checker may read two or more data sets, containing responses at one or more different levels of abstraction, to requests sent by the testbench executable program 110. The equivalence checker may then determine an equivalence of the responses found in the two or more data sets for each level of abstraction of the sub-components 130.

The data sets may constitute functional results, derived from simulations of the sub-components 130 represented at two or more different abstraction levels. The system would then compare the first set of functional results to the second set of functional results when a stimulus from the testbench executable program 110 is generated at a same level of abstraction. For example, the functional results may be the particular behavior of the sub-component to the applied stimulus, such as whether an expected logic value occurs or an expected blocking of a signal occurs, etc. The results may be derived from an electronic system design under verification represented at one or more levels of abstraction.

The data sets may constitute timing data, such as a number of cycles, actual time increments, accurate time spans in the transaction flow, etc. derived from a first simulation of the sub-components 130 represented at a first abstraction level. The system would then compare the first timing data to a second timing data when a stimulus from the testbench executable program 110 is generated at a same level of abstraction. The system is able to directly compare the functional results and the timing data results because a monitor program reads values stored in the channel between the transactor and the interface port. The values stored in the channel are always at the same level of abstraction regardless of the level of abstraction of the sub-component of the electronic system design under verification 130. In an embodiment, the accurate time spans in the transaction flow may be described as the span (latency) between the first request and the first response of a transaction, and the span between the first request and the last response of a transaction. The tool then establishes a figure of merit for the timing correlation based on the mean and deviation of these 2 statistics.

The system may also complete co-validation by verifying end to end checks concurrently with comparing timing results from the sub-components of the electronic system design under verification 130 at different levels of abstraction. This may eliminate the need for an additional validation step of verifying end to end checks, such as stimulus inputted into the electronic system to expected results from the electronic system design, at each level of abstraction.

In an embodiment, the end to end checks involve the testbench issuing a directed set of transactions to observe a particular response. The simplest case is a write transaction followed by a read transaction of the same length and at the same address to ensure the written data is returned by the read. A more complete approach involves the testbench maintaining an image of the system address space and recording every write into that image and matching every read response with the one expected by the image. The latter approach means the testbench needs full knowledge of the functional specification of the system under test, which is typical and also justifies the testbench as a critical reuse component.

The modeling tool may be part of a computing system made up of a processor component to execute instructions from the testbench executable program that generate and apply a sequence of test patterns and expected test results to sub-components of a design of an electronic system under verification at two or more levels of abstraction.

Figure 6:
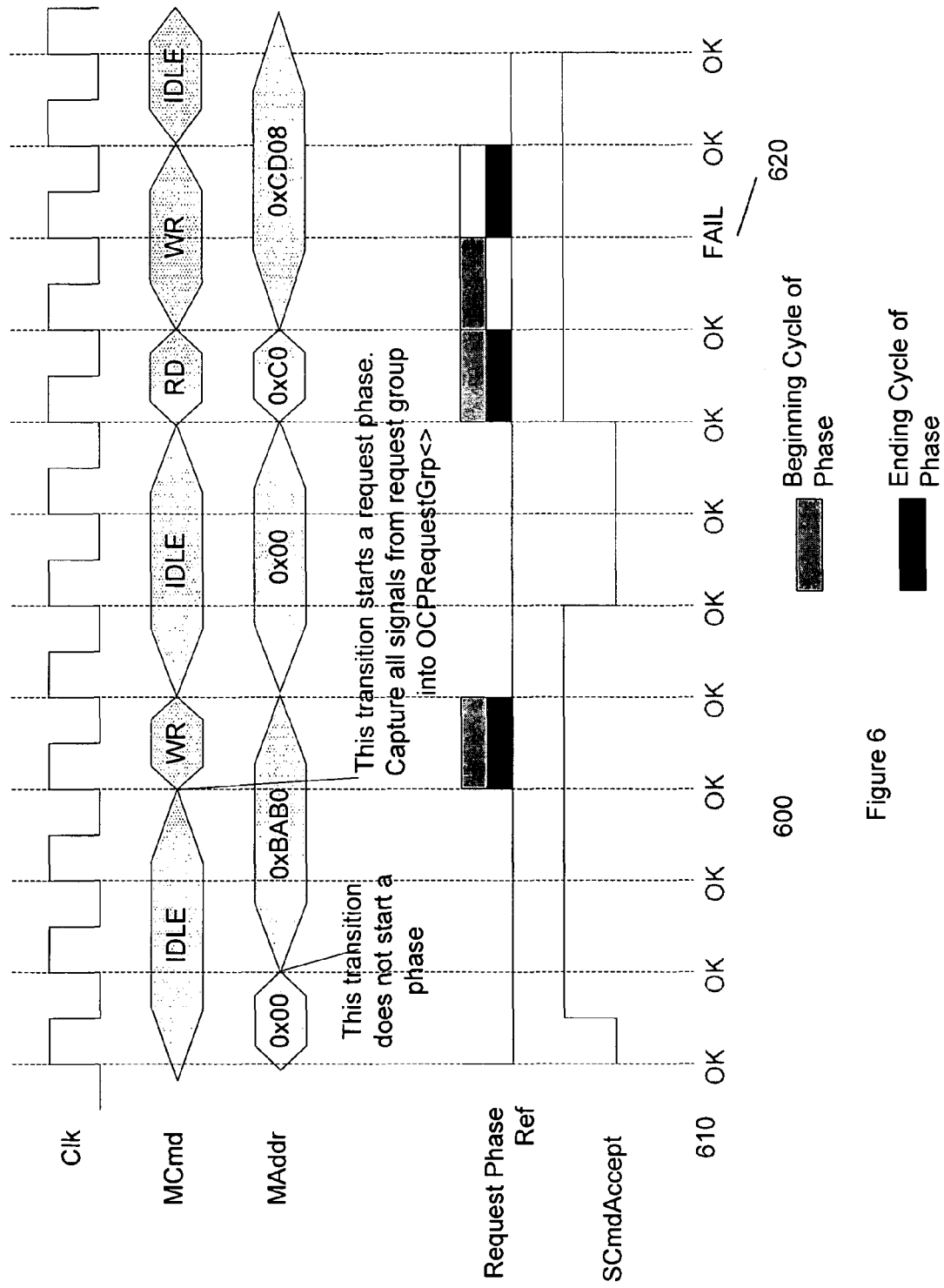
FIG. 6 illustrates a graph of an embodiment of a systematic correlation.

FIG. 6 illustrates a graph of an embodiment of systematic correlation. The graph 600 shows a clock signal, a command signal, an address signal, a request phase reference, and a command acceptance signal. The graph 600 also shows the beginning cycle of a phase and the ending cycle of a phase. Phase definitions of OCP, for example for TL0/TL1 StartRequest, may be used to establish a systematic correlation using the example of the request phase. The transition of an example write request starts the request phase. The monitors capture all signals from the request group into an OCPRequestGrp<> structure. The monitors may capture all of the signals from the request group from different levels of abstraction of the sub component being correlated and then correlate those signals from the demarcation of the initiating event such as the transition of the example write request. This results in a per clock cycle correlation success or failure shown as attribute 610. The clock edge labeled 620 shows a mismatch that the modeling tool reports to the user.

Figure 7:
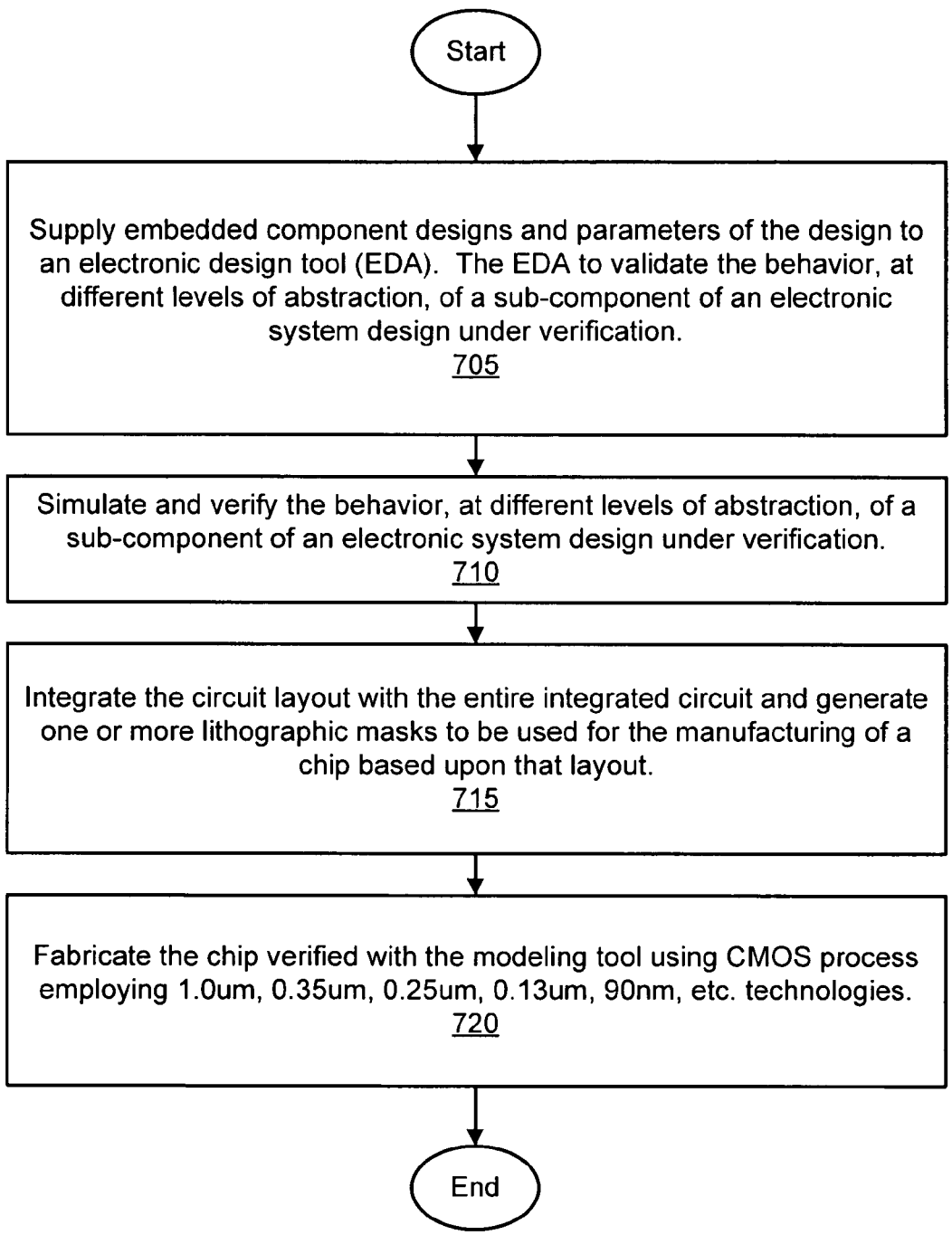
FIG. 7 illustrates a flow chart of an embodiment of verifying and generating various electronic design systems.

FIG. 7 illustrates a flow chart of an embodiment of verifying and generating various electronic design systems. The information representing the apparatuses and/or methods may be contained in a modeling tool. The information representing the apparatuses and/or methods stored on the machine-readable medium may be used in the process of creating the apparatuses and/or methods described herein.

The modeling tool may be used for verifying highly configurable, scalable System On a Chip sub components. In an embodiment, an example modeling tool may include the following: a graphic user interface; a common set of processing elements; and a library of files containing design elements such as circuits, control logic, and cell arrays. Traditionally, there exist two major stages of SOC design: front-end processing and back-end programming. Front-end processing consists of the design and architecture stages, which includes design of the SOC schematic. The front-end processing may include connecting models, configuration of the design, simulating and tuning during the architectural exploration. The design is simulated and tested. Front-end processing traditionally includes simulation of the circuits within the SOC and verification that they work correctly. The integration of the electronic circuit design may include packing the cores, verifying the cores, simulation and debugging. The tested and verified components then may be stored as part of a library. The modeling tool that can be used for verification and validation of an electronic system design, as well as other applications.

Back-end programming traditionally includes programming of the physical layout of the SOC such as placing and routing, or floor planning, of the circuit elements on the chip layout, as well as the routing of all interconnects between components. Thus, the floor plan may be generated imported and edited. After this, the design may be outputted into a Netlist of one or more hardware design languages (HDL) such as Verilog, VHDL (Very-High-Speed Integrated Circuit Hardware Description Language) or SPICE (Simulation Program for Integrated Circuit Emphasis). A Netlist describes the connectivity of an electronic design such as the components included in the design, the attributes of each component and the interconnectivity amongst the components. After the Netlist is generated, synthesizing of the design with Register Transfer Level (RTL) may occur. Accordingly, back-end programming further includes the physical verification of the layout to verify that it is physically manufacturable and the resulting SOC will not have any function-preventing physical defects. The front-end views support documentation, simulation, debugging, and testing. The back-end files, such as a layout, physical Library Exchange Format (LEF), etc are for layout and fabrication.

In block 705, the electronic system design as well as other embedded component designs parameters are supplied to the modeling tool. The modeling tool may include object code in a set of executable software programs in order to run actual operation and configuration simulations. The modeling tool will be used to validate the behavior, at different levels of abstraction, of a sub-component of an electronic system design under verification.

In block 710, the modeling tool may provide test data to validate, verify and debug the designs by simulating and verifying the operation of each sub-component of an electronic system design under verification at different levels of abstraction. The machine may also generate simulations of representations of the circuits described above that can be functionally tested, timing tested, debugged and validated.

The modeling tool may have its instructions, executable code sequences, data files, etc stored on a machine-readable storage medium. A machine-readable storage medium may include any mechanism that provides (e.g., stores and/or transmits) information in a form readable by a machine (e.g., a computer). For example, a machine-readable medium may include, but is not limited to: read only memory (ROM); random access memory (RAM); magnetic disk storage media; optical storage media; flash memory devices; DVD's; EPROMs; EEPROMs; FLASH, magnetic or optical cards; or any other type of media suitable for storing electronic instructions.

In block 715, the circuit layout of a verified an IP block may be integrated with the entire integrated circuit. One or more lithographic masks may be generated from to be used for the manufacturing of a chip based upon that layout.

In block 720, the chip verified with the modeling tool may be fabricated using CMOS process employing 1.0 um, 0.35 um, 0.25 um, 0.13 um, 90 nm, etc. technologies.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components. The hardware logic consists of electronic circuits that follow the rules of Boolean Logic, software that contain patterns of instructions, or any combination of both. The invention is to be understood as not limited by the specific embodiments described herein, but only by scope of the appended claims.

What is claimed is:
1. A modeling tool used for verifying System on a Chip (SoC) sub components and stored on a non-transitory machine-readable medium for a computing system, comprising:
    a transactor configured to translate a behavior of one or more subcomponents between two or more different levels of abstraction derived from a same electronic system design under verification based upon an applied sequence of test patterns and expected test results from a same instance of a testbench executable program, where the transactor is also configured to convert stimulus responses sent from the the one or more sub-components of the electronic system design under verification from a first level of abstraction that the electronic system design under verification possesses to a second level of abstraction that the testbench executable program is at, where the transactor is configured to apply the sequence of test patterns and expected test results from the testbench executable program to the sub-components of the electronic system design under verification at the first level of abstraction;
    a timing module configured to generate correlation measurements of timing approximation between the different levels of abstraction of the sub-components so that the timing approximation between the different levels of abstraction is accurate between the different levels of abstraction for each cycle of operation of same sub-components of the electronic system design under verification; and a functional correlation module configured to establish a functional correlation between the different levels of abstraction of the sub-components, where the functional correlation includes analysis of the behavior of the sub-components to applied stimulus from the testbench executable program, including 1) whether an expected logic value occurred, 2) whether an expected blocking of a signal occurred, and 3) any combination of these two, and where the correlation of measurements of timing approximation includes analysis of recorded timing data between the two or more levels of abstraction of the sub-components, wherein the applied sequence of the test patterns and expected test results from testbench executable program are applied in parallel to the sub-components at the different levels of abstraction in order to make the correlation of measurements of timing approximation between the different levels of abstraction of the sub-components, and wherein the testbench executable program, the transactor, the timing module and the functional correlation module are stored and executed on the non-transitory machine readable medium.

2. The modeling tool of claim 1, where a first instance of the transactor is configured to translate a timing behavior of the sub-components between one or more of the two or more different levels of abstraction derived from the electronic system design under verification;

where a second instance of the transactor is configured to translate a functional behavior of the sub-components between the one or more of the two or more different levels of abstraction derived from the electronic system design under verification; and where the timing module and the functional correlation module are configured to cooperate to establish the functional correlation and the timing approximation between the different levels of abstraction of the subcomponents of the electronic system design under verification having the same testbench executable program applied to all levels of abstraction of the electronic system design under verification based on translations of the electronic system design under verification based on translations from the first instance of the transactor and the second instance of the transactor.

3. The modeling tool of claim 1, further comprising:

one or more monitor components configured to record behavioral descriptions of the sub-components between the two or more different levels of abstraction from the electronic system design under verification having the same instance of the testbench executable program applied to all of the different levels of abstraction, where a first monitor component is coupled to a first channel that receives requests from a first instance of the electronic system design under verification at the first level of abstraction, and a second monitor component is coupled to a second channel that receives responses from a second instance of the electronic system design under verification at the second level of abstraction; and where the timing module and the functional correlation module are also configured to correlate recorded behavioral descriptions of the sub-components between the two or more different levels of abstraction from the electronic system design under verification based on the recorded behavioral descriptions of the sub-components coming from the first and second monitor components.

4. The modeling tool of claim 3, where the functional correlation made by the functional correlation module is configured to further include identifying that all of the transactions from the applied stimulus from the testbench executable program are present as determined by the requests and the responses collected by the monitors coupled to the electronic system design under test at the two or more levels of abstraction.

5. The modeling tool of claim 1, where the functional correlation made by the functional correlation module further includes a functional match between two or more traces of transactions at the different levels of abstraction from the applied sequence of the test patternd from the testbench executable program, where 1) when transactions at the different levels of abstraction are expected to be found in a same order, then the timing approximation is simple matching and 2) when the transactions are not in order, then the testbench executable program assigns a unique identifier to each of the transactions from the applied sequence of test patterns in order to track transaction order, and the unique identifiers will be found in the traces of the transactions at the different levels of abstraction since a same instance of the testbench executable program is used.

6. The modeling tool of claim 1, where the modeling tool has one or more comparators conficiured to directly compare the functional results and the timing data results via one or more monitor components that read values stored in a channel between the transactor and an interface port of a transactional-testbench interface, where the transactional-testbench interface is configured to allow the transactor to access the applied stimulus sequences generated by the testbench executable program.

7. The modeling tool of claim 1, where the testbench executable program has two or more associated buffers, and the transactor is configured to receive testbench transactions and sends them to a channel, where a first buffer associated with the testbench executable program stores the transactions until the transactor is ready to receive the testbench transactions and convert the testbench transactions to the level of abstraction of the sub-components of the electronic system design under verification, where a second buffer is configured to store responses from the electronic system design under verification, via a transactional-testbench interface until those responses are analyzed, where the transactor converts the responses from the electronic system design under verification to the level of abstraction of the testbench executable program.

8. The modeling tool of claim 1, wherein the testbench executable program includes code scripted as the applied sequence of test patterns and the expected test results used to validate the behavior of the one or more sub-components, and a same instance of the testbench executable program is configured to provide the applied sequence of test patterns and the expected test results to validate the one or more sub-components, which are coded to be modeled, at the two or more different levels of abstraction.

9. The modeling tool of claim 1, wherein a first module is configured to perform end to end checks to verify the entire electronic system design under verification and performs these end to end checks concurrently with comparing timing results from the sub-components of the electronic system design under verification at the two or more different levels of abstraction, where the end to end checks include an issuing of a directed set of transactions in order to observe a particular expected response at the boundaries of the entire electronic system design under verification.

10. The modeling tool of claim 1, further comprising:
a first transaction monitor located on a first test channel and configured to read a first data set, containing a response at the first level of abstraction to a request sent by the testbench executable program;
a second transaction monitor located on a second test channel and configured to read a second data set, containing a response at the second level of abstraction obtained for a request sent by the testbench executable program; and
where the functional correlation module is configured to determine an equivalence of the responses found in the first data set and the second data set for each level of abstraction of the sub-components.

11. The modeling tool of claim 1, wherein the first level of abstraction is a Register-transfer level (RTL) modeling of the electronic system design under verification and the second level of abstraction is a transaction level 2 (TL2) modeling of the electronic system design under verification.

* * * * *